(12) United States Patent
Lowes et al.

(10) Patent No.: US 11,005,644 B2
(45) Date of Patent: May 11, 2021

(54) TIME STAMP GENERATION

(71) Applicant: Arista Networks, Inc., Santa Clara, CA (US)

(72) Inventors: Russell Andrew Lowes, Haberfield (AU); Andrew Bridger, Sydney (AU); Thomas Dejanovic, Canterbury (AU); David Charles Ambler Snowdon, Darlinghurst (AU)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 16/438,360

(22) Filed: Jun. 11, 2019

(65) Prior Publication Data
US 2020/0396052 A1 Dec. 17, 2020

(51) Int. Cl.
| | |
|---|---|
| *H04L 7/04* | (2006.01) |
| *H04L 7/033* | (2006.01) |
| *H04L 7/00* | (2006.01) |
| *H03L 7/08* | (2006.01) |
| *H03L 7/085* | (2006.01) |

(52) U.S. Cl.
CPC ............ *H04L 7/042* (2013.01); *H03L 7/085* (2013.01); *H03L 7/0807* (2013.01); *H04L 7/0087* (2013.01); *H04L 7/0331* (2013.01)

(58) Field of Classification Search
CPC . H03L 7/06; H03L 7/07; H03L 7/0807; H03L 7/083; H03L 7/085; H03L 7/093; H03L 7/24; H04L 7/0016; H04L 7/0058; H04L 7/0087; H04L 7/033; H04L 7/0331; H04L 7/042

USPC ....... 375/326, 327, 354–356, 371, 373, 376; 327/141, 144, 145, 147, 151, 156, 160; 713/400, 500–103, 600, 601
See application file for complete search history.

(56) References Cited

U.S. PATENT DOCUMENTS 10,509,104 B1 * 12/2019 Dato .................. G01S 7/032
2002/0001309 A1   1/2002 Saito
(Continued)

OTHER PUBLICATIONS

Chakarov et al., "Combining time and frequency domain specification for periodic signals." In International Conference on Runtime Verification, Aug. 26, 2011, Retrieved on Aug. 11, 2020 from <URL:https://www.cs.colorado.edu/~srirams/papers/rv2011.pdf>.
(Continued)

*Primary Examiner* — Young T. Tse
(74) *Attorney, Agent, or Firm* — Fountainhead Law Group P.C.

(57) ABSTRACT

Embodiments of the present disclosure include techniques for generating accurate time stamps. In one embodiment, a first timing reference signal corresponding to a first clock domain is combined with a first clock signal corresponding to a second clock domain to produce a second timing reference signal that includes quantization noise. The second timing reference signal is filtered to remove the quantization noise and generate a filtered timing reference signal. The filtered timing reference signal may be sampled in the second clock domain to obtain a time stamp. In one embodiment, a phase locked loop (PLL) is used as the filter. The PLL may generate first and second ramps that correspond to time. One of the ramps may be sampled to obtain a time stamp, for example.

22 Claims, 7 Drawing Sheets

(56) References Cited

U.S. PATENT DOCUMENTS

| | | | |
|---|---|---|---|
| 2004/0062278 A1 | 4/2004 | Hadzic et al. | |
| 2004/0114469 A1* | 6/2004 | Duffner | G04F 10/00 |
| | | | 368/113 |
| 2005/0286507 A1 | 12/2005 | Osterling et al. | |
| 2007/0047458 A1 | 3/2007 | Adkisson | |
| 2009/0319065 A1* | 12/2009 | Risbo | G11B 20/10527 |
| | | | 700/94 |
| 2013/0077642 A1* | 3/2013 | Webb, III | H04J 3/0697 |
| | | | 370/503 |
| 2016/0373125 A1 | 12/2016 | Pagnanelli | |
| 2019/0280698 A1* | 9/2019 | Kearney | H03C 3/0925 |

OTHER PUBLICATIONS

International Search Report and Written Opinion, PCT Application No. PCT/US2020/035771, dated Sep. 2, 2020, 8 pages.

* cited by examiner

TIME STAMP GENERATION

BACKGROUND

The present disclosure pertains to electronic circuits and systems, and in particular, to techniques for generating time stamps. Particular applications of the techniques described herein may be useful in networking equipment.

Many electronic applications have a need to have an extremely clear understanding of the temporal nature of their systems. For example, in financial networks, algorithmic traders have a need to be able to measure the tick-to-trade performance of their systems. Others still need an accurate view into the practical implications of (for example) cache misses and DRAM refreshes on computational workloads by precisely timestamping the network traffic stemming from those workloads.

The following disclosure provides improved and advantageous techniques for generating accurate time stamps.

DETAILED DESCRIPTION

Described herein are techniques for generating time stamps. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
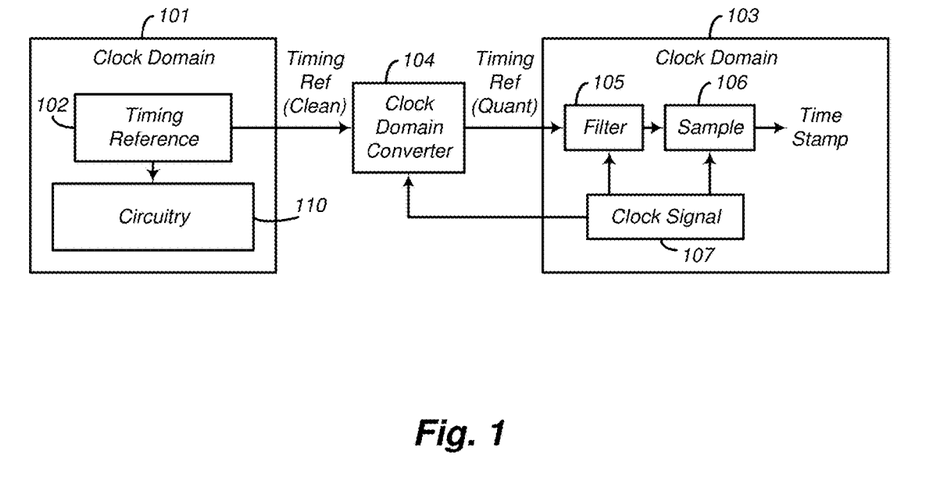
FIG. 1 illustrates a system for generating a time stamp according to an embodiment.

FIG. 1 illustrates a system for generating a time stamp according to an embodiment. Features and advantages of the present disclosure may include filtering quantization noise from a signal coupled between clock domains to obtain a highly accurate time stamp. In this example, a timing reference 102 may be used to provide a time base to circuitry 110. Timing reference 102 may form a first clock domain 101, for example. In some applications, it may be desirable to couple timing reference 102, which may be very accurate, into a second clock domain 103 for purposes of generating a time stamp. In this example, timing reference 102 is coupled to clock domain converter circuit 104. Clock domain converter circuit 104 also receives a clock signal 107 which forms second clock domain 103. Clock domain converter circuit 104 may introduce timing reference 102 into clock domain 103. However, as a clean timing reference 102 transitions into clock domain 103, quantization noise may be introduced into timing reference 102, for example. Embodiments of the present disclosure include a filter 105 to receive the timing reference including the quantization noise. Filter 105 may filter out the quantization noise in the second clock domain 103, for example. The output of filter 105 may be coupled to a sample circuit 106. Sample circuit 106 may sample a signal on the output of the filter (e.g., a filtered timing reference) to produce a value corresponding to a precise time (a time stamp). In some embodiments described in more detail below, the sampled value may be the least significant bits (LSB) of the time stamp, for example, where high accuracy is advantageous. As illustrated, in some embodiments filter 105 and sample circuit 106 may also receive clock signal 107 so that the time stamp has the benefit of the accuracy of timing reference 102 in the first clock domain 101 and is also synchronized with clock signal 107 in the second clock domain 103, for example. Various embodiments of the present disclosure may include analog circuits, digital circuits, or combinations of analog and digital circuits, for example, various implementations of which would be known to those skilled in the art based on the present disclosure.

Figure 2:
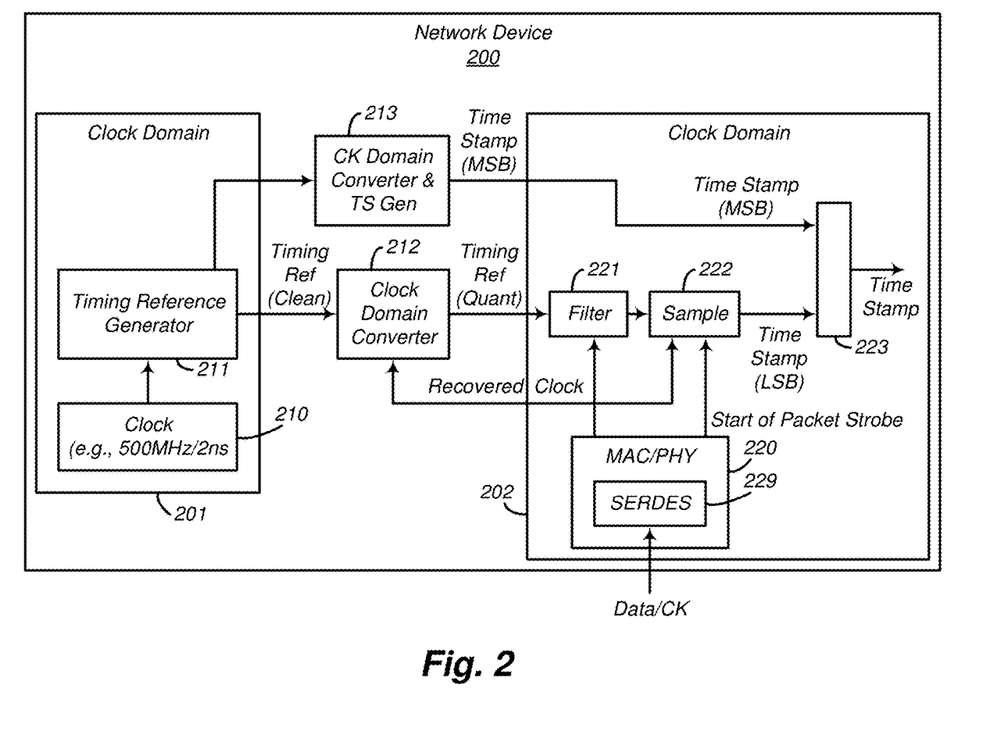
FIG. 2 illustrates an example network device including circuitry for generating a time stamp according to an embodiment.

FIG. 2 illustrates an example network device including circuitry for generating a time stamp according to an embodiment. In this example, network device 200 includes a highly accurate clock 210 (e.g., a 500 MHz/2 ns "golden" clock) forming a first clock domain 201. Clock 210 may be manipulated by a timing reference generator 211 to produce a clean timing reference. In some example embodiments described in more detail below, timing reference generator 211 may comprise a down converter (e.g., a divider) to translate clock 210 to a lower frequency (e.g., 16 ns) timing reference toggle signal, for example. An output of timing reference generator 211 comprising a clean timing reference (e.g., a toggle signal) may be coupled to clock domain converter 212 and a second output of timing reference generator 211 may be coupled to clock domain converter and time stamp (TS) generator 213, which may provide the most significant bits (MSBs) of a time stamp, for example.

In this example, clock domain converter 212 also receives a recovered clock signal. The recovered clock signal may be received and recovered along with data from a physical layer (PHY) and media access channel (MAC) 220. The recovered clock signal may be from a data communication channel PHY may receive data via a serial-deserializer (SERDES) circuit 229 for communicating data bits between devices in a network serially at very high speeds, for example. The recovered clock signal may form clock domain 202, for example. Accordingly, clock domain converter 212 may receive a clean timing reference and a recovered clock and produce a timing reference synchronized to the recovered clock with quantization noise introduced into the timing reference as a result of the synchronization process, for example.

Advantageously, the quantization noise may be filtered out of the timing reference signal by coupling the output of clock domain converter 212 to filter 221 and sampling the output of filter 221 using sampling circuit 222. Filter 221 and/or sampling circuit 222 may be configured to receive the recovered clock, for example, to synchronize the processing of the timing reference to the second clock domain 202. Filter 221 may be a low pass filter, for example. Sample circuit 222 may be configured to receive a start of packet strobe from MAC/PHY circuit 220. Accordingly, sample circuit 222 may sample a filtered timing reference (with quantization noise filtered out) in response to the start of packet signal and synchronously with the recovered clock signal, for example. The sample may form the LSB of a time stamp, which may be combined with the MSB of the time stamp to form a complete time stamp, for example. Advantageously, the time stamp has the accuracy of the "golden" clock in the first clock domain 201 and is synchronous with the recovered clock in the second clock domain 202. Accordingly, using the techniques described herein any bit within a bit stream may be time stamped. For example, in one embodiment, simple linear interpolation can be performed to effectively timestamp any bit within the serialised bitstream once the start of packet time stamp is generated.

Figure 3:
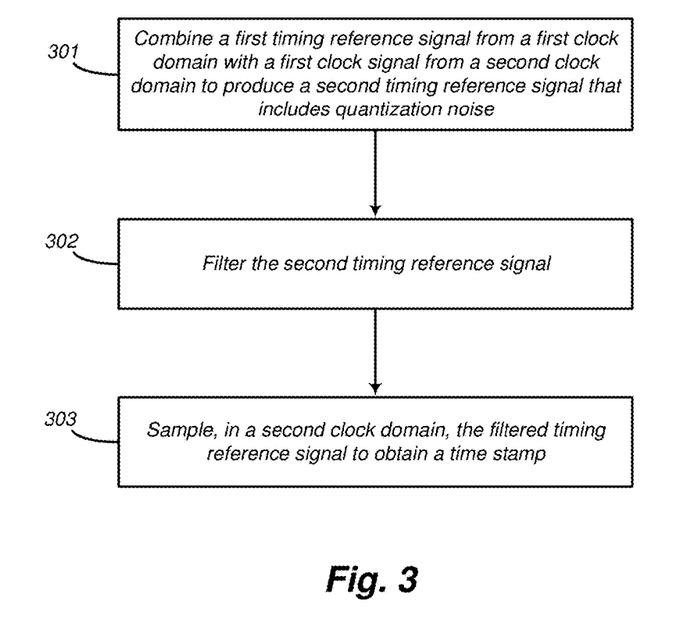
FIG. 3 illustrates a process for generating a time stamp according to an embodiment.

FIG. 3 illustrates a process for generating a time stamp according to an embodiment. At 301, a first timing reference signal from a first clock domain is combined with a first clock signal from a second clock domain to produce a second timing reference signal that include quantization noise. The first clock signal may be a recovered clock signal from a data communication channel. At 302, the second timing reference is filtered, in the second clock domain, to remove the quantization noise. At 303, the filtered timing reference signal is sampled, in the second clock domain, to obtain a time stamp.

Figure 4A:
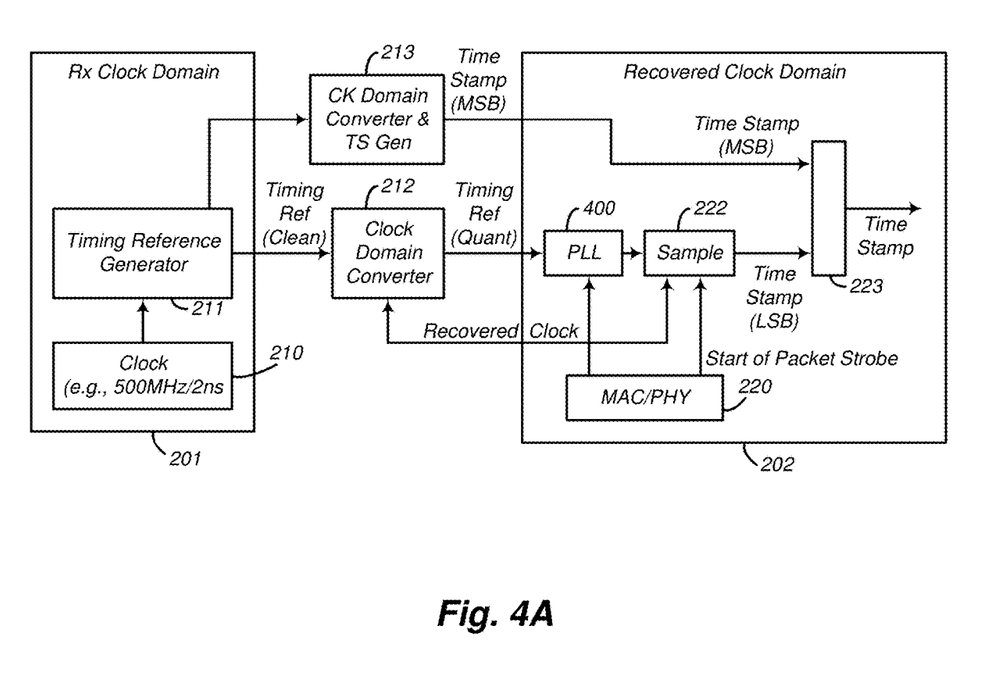
FIG. 4A illustrates an example system including a phase locked loop for generating a time stamp according to another embodiment.

FIG. 4A illustrates an example system for generating a time stamp according to another embodiment. In this example, the filter is implemented using a phase locked loop (PLL) 400. For example, an output of clock domain converter 212 producing the timing reference signal with quantization noise may be coupled to an input of the PLL 400. PLL 400 further receives the recovered clock signal from MAC/PHY 220, for example. As illustrated in various examples below, a PLL may be used to produce a signal representing time, where the time has the accuracy of the clean timing reference from clock domain 201 and is also synchronized with the recovered clock in the recovered clock domain 202. The signal at the output of the PLL may then be sample to obtain an accurate time stamp (e.g., for packets in the network). Accordingly, in some embodiments PLL 400 may be referred to as a time locked loop (TLL). The PLL may comprise digital circuits.

Figure 4B:
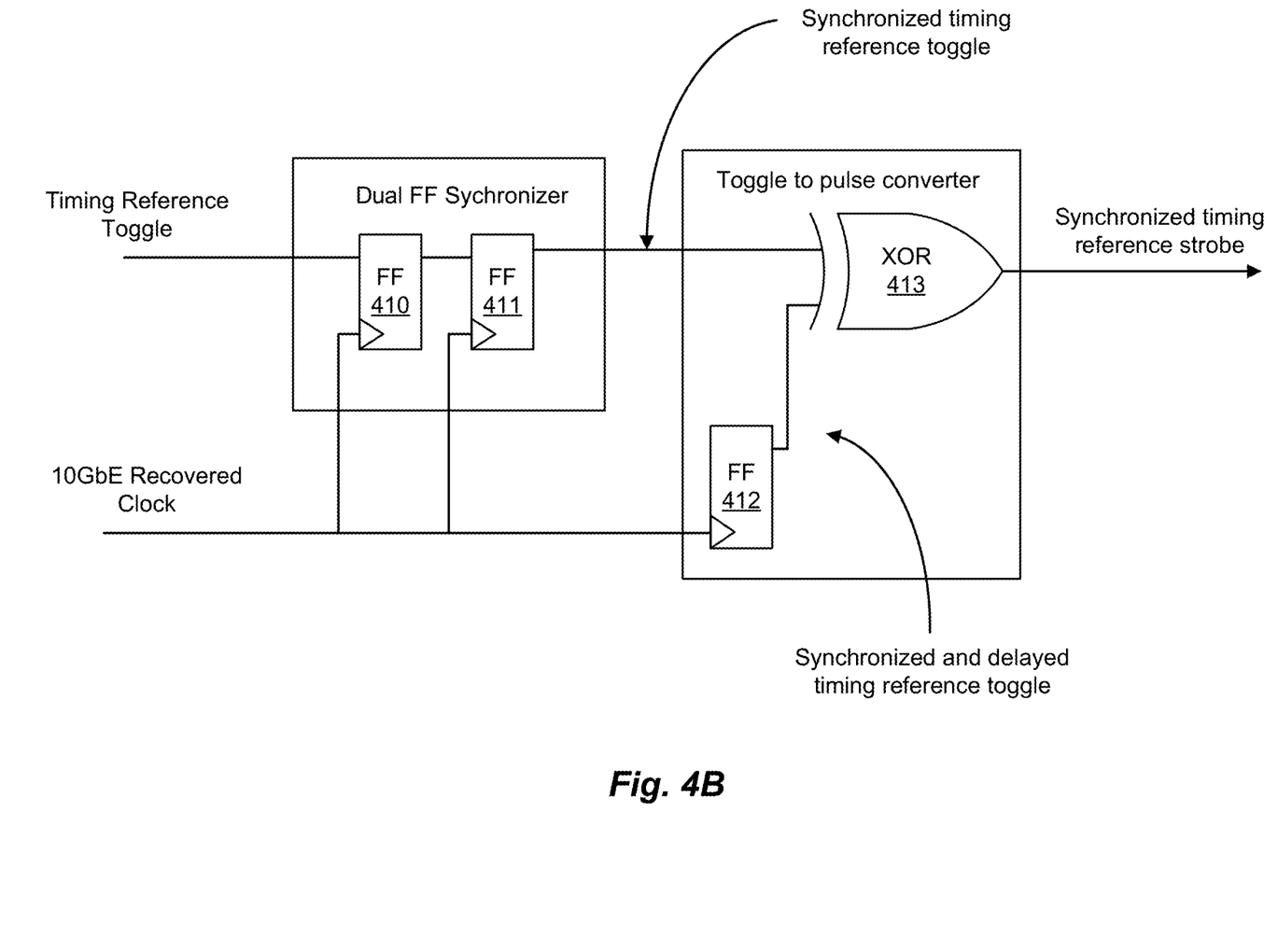
FIG. 4B illustrates an example clock domain converter according to an embodiment.

FIG. 4B illustrates an example clock domain converter according to an embodiment. In this example, the clean timing reference signal is a timing reference toggle, and the clock in the second clock domain is a 10 GbE recovered clock. The timing reference toggle is coupled through series flip flops 410 and 411. The flip flops are clocked by the recovered clock to synchronize the timing reference toggle to the recovered clock domain. In this example, the synchronized timing reference toggle is converted to a synchronized timing reference strobe using flip flop 412 and XOR circuit 413. The synchronization process introduces quantization noise in the timing reference strobe, which may manifest as a non-constant period, for example.

Figure 5:
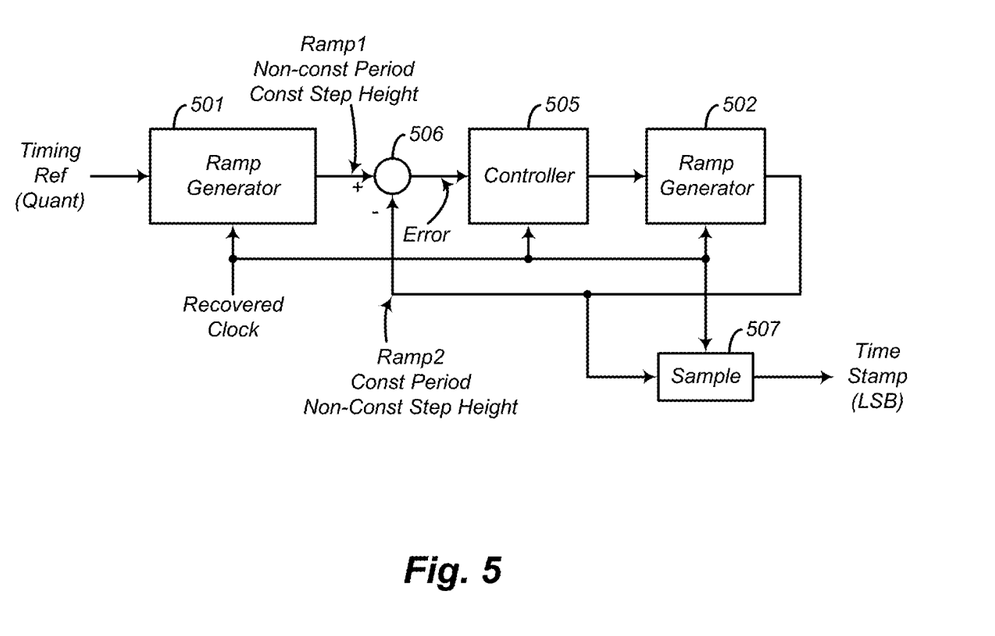
FIG. 5 illustrates an example circuit for generating a time stamp according to an embodiment.

FIG. 5 illustrates an example circuit for generating a time stamp according to an embodiment. In this example embodiment, a timing reference including quantization noise is received at the input of the circuit with a clock (e.g., the recovered clock). In this example, the circuit includes a first ramp circuit 501, second ramp circuit 502, controller 505, and difference circuit 506. Ramp circuit 501 (aka, ramp generator) is configured to receive a periodic timing reference signal, which may have quantization noise, for example. In one embodiment, the quantization error causes the timing reference signal to have a non-constant period. Ramp circuit 501 may produce a first stepped ramp signal ("Ramp1") having constant step heights and non-constant step periods corresponding to the non-constant period of the periodic timing reference signal. An error signal is generated by difference circuit 506, which may perform a subtraction of Ramp1 from a second stepped ramp signal ("Ramp2") having non-constant step heights and constant step periods as described further below. The error signal at the output of circuit 506 (e.g., a difference between the first stepped ramp signal and the second stepped ramp signal) is received at an input of controller 505. Controller 505 also receives a clock signal, which in this example is a recovered clock signal. Controller 505 produces a control signal to control second ramp circuit 502. Second ramp circuit 502 is configured to receive the control signal and a second periodic signal (here, the recovered clock) and produce a second stepped ramp signal ("Ramp2") having non-constant step heights corresponding to the control signal and constant step periods corresponding to the second periodic signal. For example, Ramp2 may have step periods equal to the period of the recovered clock. The step heights may be controlled so that the period of Ramp2 matches the period of Ramp1 (e.g., the error signal is minimized), for example. Accordingly, Ramp1 may correspond to successively increasing time, where each period of the timing reference input signal causes the ramp to increase a step. If Ramp1 and Ramp2 are configured as shown in FIG. 5, the value of Ramp2 corresponds to a time. Accordingly, Ramp2 may be sampled by sample circuit 507 to obtain a time that is derived from a clean timing reference and also synchronous with the recovered clock.

Figure 6:
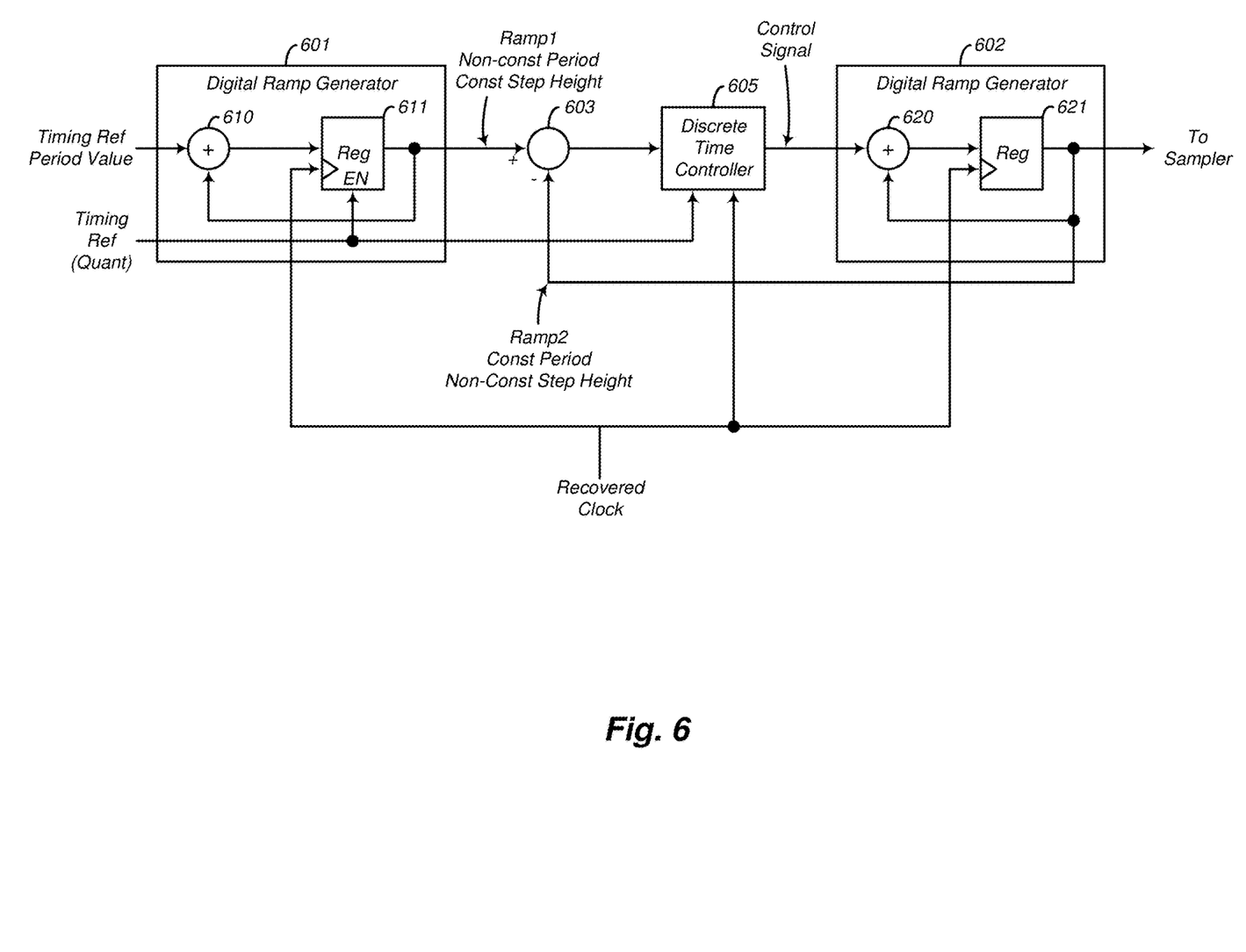
FIG. 6 illustrates a discrete time circuit to generate a time stamp according to another embodiment.

FIG. 6 illustrates a discrete time circuit to generate a time stamp according to another embodiment. In this example, the circuit includes digital ramp generator 601, digital ramp generator 602, difference circuit 603 (e.g., a digital subtractor), and discrete time controller 605. Digital ramp generators 601 and 602 may be accumulator circuits, for example. For instance, digital ramp generator 601 receives the timing reference signal (including quantization noise) and a timing reference period value. The timing reference period value may be a constant digital value equal to the period of a clean timing reference signal before quantization (e.g., 16 ns). The timing reference period value thus represents what the timing reference period should be, for example. The timing reference period value is provided as an input to an adder 610. An output of adder 610 is coupled to one input of a register 611, and an output of register 611 is coupled to another input of adder 610 to form an accumulator (e.g., or counter). When register 611 is triggered to receive the next value from adder 610, the digital value in register 611 increments up by the same amount (e.g., the timing reference period value). Thus, the output of register 611, which may also be the output of digital ramp generator 601, is a stepped ramp having constant step heights equal to the timing reference period value. A clock input of register 611 is configured to receive a periodic clock signal forming the second clock domain (e.g., the recovered clock), and an enable input (EN) of register 611 is configured to receive the timing reference signal with quantization error. As mentioned above, the timing reference signal may have a non-constant period due to the quantization error. Accordingly, the stepped ramp output will have a non-constant step period (or width) as illustrated in more detail in diagrams in FIG. 8 below.

Discrete time controller 605 generates a control signal (e.g., a digital value), which is provided as an input to digital ramp generator 602. The control signal is input to an adder 620 and register 621 configured as an accumulator similar to digital ramp generator 601 described above. However, for digital ramp generator 602, controller 605 adjusts the control signal so that an error between the stepped ramp from ramp generator 601 and the stepped ramp from ramp generator 602 is minimized Since the control signal is changing, the step height of the stepped ramp signal from digital ramp generator 602 is non-constant. However, register 621 is triggered by the recovered clock (and not also by the timing reference). Thus, the stepped ramp signal output by digital ramp generator 602 has a constant step period (or width).

The circuit of FIG. 6 may operate as follows. The periodic timing reference signal (e.g., strobes) may be used to increment ramp generator 601, which may be a free-running fixed-point, fractional precision reference time counter, for example. Ramp generator 601 increments by the nominal period of the timing reference signal (e.g., prior to quantization). The period of the timing reference signal can be any length of time, but in some embodiments may be at least two times higher than the recovered clock period, and not an integer multiple of the recovered clock period, for example. Ramp generator 602 may be fixed-point counter with fractional precision, for example, which is incremented by a variable amount such that it precisely tracks the ramp generator 601 (e.g., the reference time counter). Each time the ramp generator 601 is incremented, its value is compared to the value from ramp generator 602, and the difference between the two is stored as the error. This error term forms the input to the discrete time control system 605. The output of the discrete-time control system 605 is the variable control signal value (or amount) by which ramp generator 602 increments in order to track the time of ramp generator 601, for example. As described in more detail below, the discrete time control system 605 may, in some example embodiments, emulate a 1st order linear time-invariant system, though any control system could be used.

Figure 7:
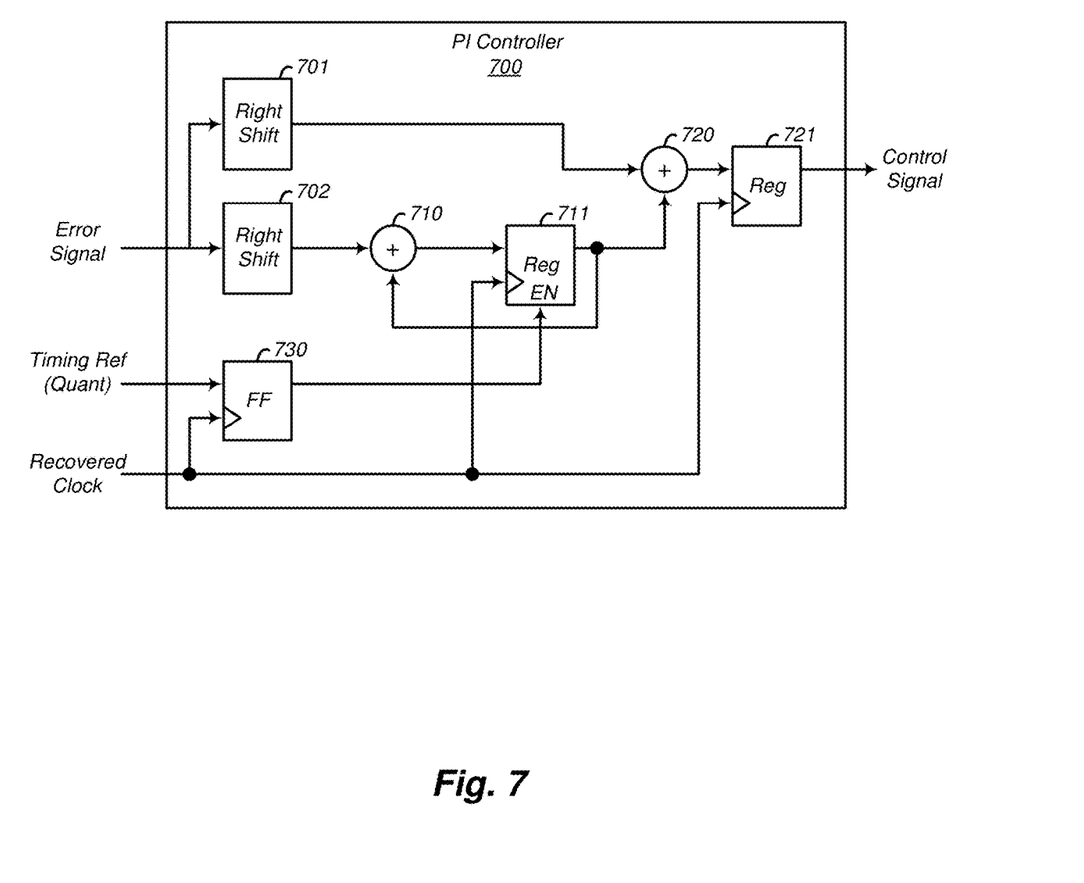
FIG. 7 illustrates an example discrete time controller according to an embodiment.

FIG. 7 illustrates an example discrete time controller according to an embodiment. In one example embodiment, controller 700 is a proportional-integral ("PI") controller, for example. Here, the error signal is coupled to inputs of two shift registers 701-702 configured to perform a right shift, which acts as a multiplication (or division) where the number of shifts sets the multiplication (division) value. Shift register 701 provides the "proportional" feature of the controller. The output of shift register 702 is coupled to an accumulator comprising adder 710 and register 711, which implements the integral feature. The timing reference signal and the recovered clock are coupled to a flip flop 730 to produce a synchronized timing reference at the output of the flip flop 730. The synchronized timing reference and the recovered clock are used to trigger register 711, for example. The output of shift register 701 (the proportional component value) and the output of shift register 711 (the integral component value) are added at 720 and coupled to the output of the controller as the control signal through output register 721 synchronized by the recovered clock. While the above example illustrates a PI controller, it is to be understood that other controller architectures could be used.

Figure 8:
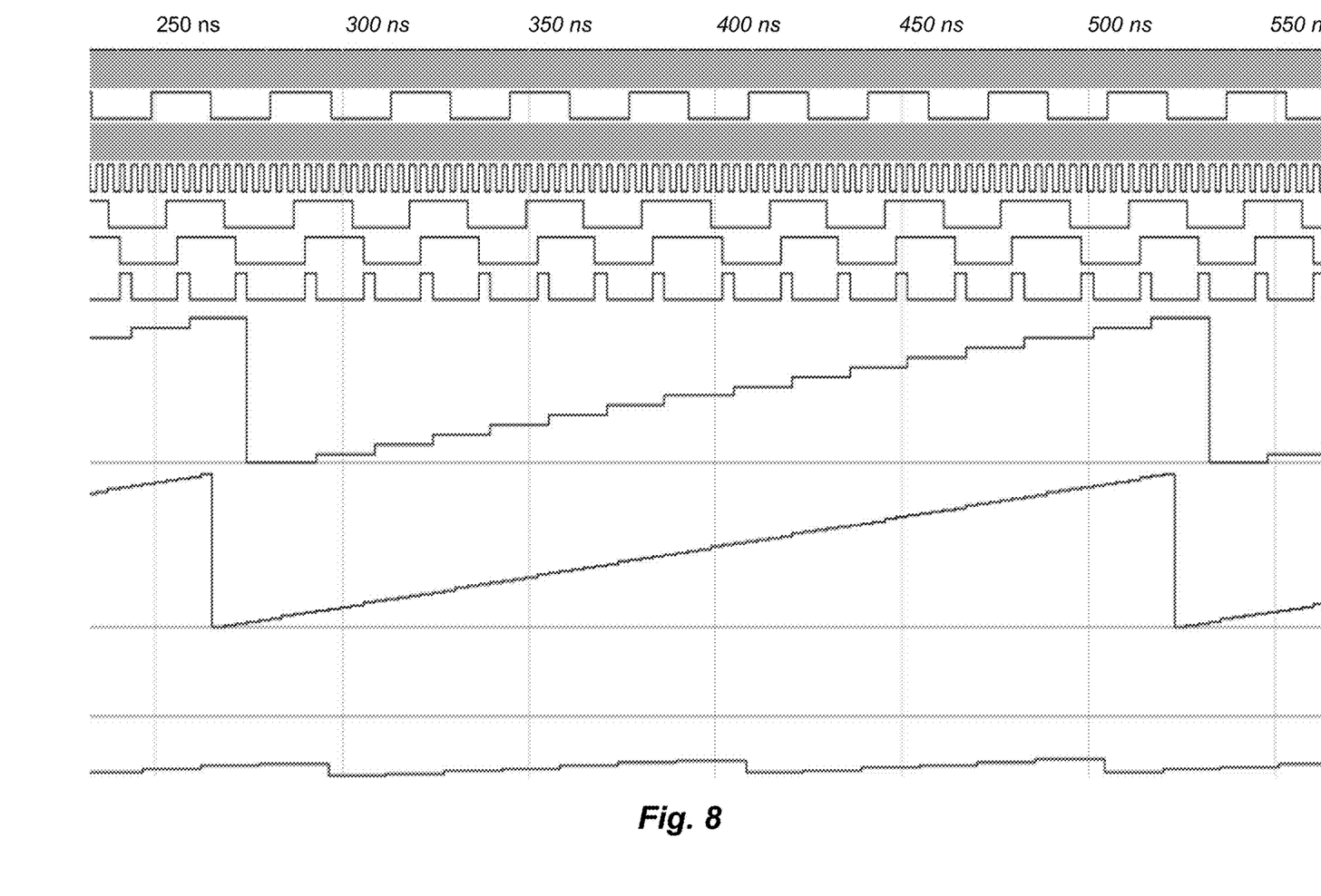
FIG. 8 illustrates an example timing diagram for a circuit according to an embodiment.

FIG. 8 illustrates an example timing diagram for a circuit according to an embodiment. In this example, an accurate clock in the first clock domain may be converted (e.g., divided down) to a clean timing reference toggle as illustrated at 801. A recovered clock is shown at 802. The clean timing reference toggle is synchronized with the recovered clock to produce a synchronized timing reference toggle with quantization noise at 803. This signal may be delayed to produce a synchronized and delayed timing reference toggle at 804. Signal 804 may be converted to a periodic timing reference strobe, for example, as shown at 805 (with quantization noise). Note that signals 803, 804, and 805 have a non-constant period due to the quantization noise. Signal 805 may be filtered by a PLL. In this example, signal 805 is coupled to an input of a digital ramp generator 601 to produce a stepped ramp with constant step height and non-constant step period as shown at 806. A second ramp generator 602 may produce a second stepped ramp 807 with constant step period (as a result of operating in sync with the recovered clock), but non-constant step height (as a result of the step height value changing with control signal 808). However, quantization noise is averaged out over the ramp waveforms. Thus, stepped ramp 807 may be sampled to obtain an accurate time stamp.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A method of generating a time stamp comprising:
combining a first timing reference signal corresponding to a first clock domain with a first clock signal corresponding to a second clock domain to produce a second timing reference signal, the second timing reference signal having quantization noise, and being synchronized with the first clock signal and asynchronous to the first timing reference signal;
filtering, in the second clock domain, the second timing reference signal to remove the quantization noise, and in accordance therewith, generating a filtered timing reference signal; and
sampling the filtered timing reference signal in the second clock domain to obtain the time stamp.

2. The method of claim 1, wherein the first clock signal is a recovered clock signal from a data communication channel.

3. The method of claim 1, wherein the filtering is performed by a low pass filter operating in the second clock domain.

4. The method of claim 1, wherein the period of the second timing reference signal is at least two times higher than the period of the first clock signal, and the period of the second timing reference signal is not an integer multiple of the period of the first clock signal.

5. The method of claim 1, wherein the filtering is performed by a phase locked loop operating in the second clock domain.

6. The method of claim 5 wherein the second timing reference signal has a non-constant period, and wherein the phase locked loop generates a first stepped ramp signal having constant step heights and non-constant step periods corresponding to the non-constant period of the second timing reference signal, and wherein the phase locked loop generates a second stepped ramp signal having non-constant step heights corresponding to a control signal and constant step periods corresponding to the first clock signal.

7. The method of claim 6 wherein the second stepped ramp signal is sampled to produce the time stamp.

8. The method of claim 6, wherein the phase locked loop comprises digital circuits, and wherein the first stepped ramp signal is generated based on a timing reference period digital value equals to the period of the second timing reference signal without the quantization noise to set the constant step heights of the first stepped ramp signal.

9. A circuit for generating a time stamp comprising:
a clock domain converter circuit configured to combine a first timing reference signal corresponding to a first clock domain with a first clock signal corresponding to a second clock domain to produce a second timing reference signal synchronized with the first clock signal and having a variable phase relative to the first timing reference signal, and the second timing reference signal having quantization noise;
a filter, in the second clock domain, configured to receive the second timing reference signal and filter out the quantization noise to produce a filtered second timing reference signal; and
a sampling circuit configure to sample the filtered second timing reference signal and produce the time stamp in the second clock domain.

10. The circuit of claim 9, wherein the first clock signal is a recovered clock signal from a data communication channel.

11. The circuit of claim 9, wherein the filter is a low pass filter.

12. The circuit of claim 9, wherein the period of the second timing reference signal is at least two times higher than the period of the first clock signal, and the period of the second timing reference signal is not an integer multiple of the period of the first clock signal.

13. The circuit of claim 9, wherein the filter is performed by a phase locked loop operating in the second clock domain.

14. The circuit of claim 9, wherein the second timing reference signal has a non-constant period, and the filter comprises:
a first ramp circuit configured to receive the second timing reference signal and produce a first stepped ramp signal having constant step heights and non-constant step periods corresponding to the non-constant period of the second timing reference signal;
a second ramp circuit configured to receive a control signal and the first clock signal and produce a second stepped ramp signal having non-constant step heights corresponding to the control signal and constant step periods corresponding to the first clock signal; and
a control circuit configured to receive a difference between the first stepped ramp signal and the second stepped ramp signal and produce the control signal.

15. The circuit of claim 14, wherein the first ramp circuit, the second ramp circuit, and the control circuit are digital circuits, and wherein the first ramp circuit receives a timing reference period digital value equals to the period of the second timing reference signal without the quantization noise to set the constant step heights of the first stepped ramp signal.

16. A network device comprising:
a first timing reference generator configured to produce a first timing reference signal in a first clock domain;
a clock recovery circuit configured to generate a recovered clock signal in a second clock domain;
a clock domain converter circuit configured to combine the first timing reference signal corresponding to the first clock domain with the recovered clock signal corresponding to the second clock domain to produce a second timing reference signal synchronized with the recovered clock signal and asynchronous to the first timing reference signal, the second timing reference signal having quantization noise;
a filter, in the second clock domain, configured to receive the second timing reference signal and filter out the quantization noise to produce a filtered second timing reference signal; and
a sampling circuit configured to sample the filtered second timing reference signal and produce a time stamp in the second clock domain.

17. The network device of claim 16, wherein the recovered clock signal is from a data communication channel.

18. The network device of claim 16, wherein the filter is a low pass filter.

19. The network device of claim 16, wherein the period of the second timing reference signal is at least two times higher than the period of the recovered clock signal, and the period of the second timing reference signal is not an integer multiple of the period of the recovered clock signal.

20. The network device of claim 16, wherein the filter is performed by a phase locked loop operating in the second clock domain.

21. The network device of claim 16, wherein the second timing reference signal has a non-constant period, and the filter comprises:
a first ramp circuit configured to receive the second timing reference signal and produce a first stepped ramp signal having constant step heights and non-constant step periods corresponding to the non-constant period of the second timing reference signal;
a second ramp circuit configured to receive a control signal and the recovered clock signal and produce a second stepped ramp signal having non-constant step heights corresponding to the control signal and constant step periods corresponding to the recovered clock signal; and
a control circuit configured to receive a difference between the first stepped ramp signal and the second stepped ramp signal and produce the control signal.

22. The network device of claim 21, wherein the first ramp circuit, the second ramp circuit, and the circuit are digital circuits, and wherein the first ramp circuit receives a timing reference period digital value equals to the period of the second timing reference signal without the quantization noise to set the constant step heights of the first stepped ramp signal.

\* \* \* \* \*